(12) United States Patent
Liao

(10) Patent No.: US 9,741,446 B2
(45) Date of Patent: Aug. 22, 2017

(54) MEMORY SYSTEM WITH SMALL SIZE ANTIFUSE CIRCUIT CAPABLE OF VOLTAGE BOOST

(71) Applicant: eMemory Technology Inc., Hsin-Chu (TW)

(72) Inventor: Wei-Wu Liao, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 15/233,970

(22) Filed: Aug. 11, 2016

(65) Prior Publication Data

US 2017/0053707 A1    Feb. 23, 2017

Related U.S. Application Data

(60) Provisional application No. 62/206,828, filed on Aug. 18, 2015.

(51) Int. Cl.
  *G11C 17/16*   (2006.01)
  *G11C 17/18*   (2006.01)
  *H02J 4/00*    (2006.01)

(52) U.S. Cl.
  CPC ............. *G11C 17/16* (2013.01); *G11C 17/18* (2013.01); *H02J 4/00* (2013.01)

(58) Field of Classification Search
  None
  See application file for complete search history.

(56) References Cited

U.S. PATENT DOCUMENTS

| | | | |
|---|---|---|---|
| 6,346,846 B1 | 2/2002 | Bertin | |
| 2005/0169040 A1* | 8/2005 | Peng | G11C 11/405 365/149 |
| 2007/0133334 A1* | 6/2007 | Peng | G11C 17/16 365/225.7 |
| 2008/0002504 A1* | 1/2008 | Nakano | G11C 17/16 365/225.7 |
| 2008/0165564 A1* | 7/2008 | Namekawa | G11C 17/16 365/96 |
| 2008/0165586 A1* | 7/2008 | Matsufuji | G11C 17/18 365/185.23 |
| 2011/0235388 A1* | 9/2011 | Nakano | G11C 17/146 365/96 |
| 2012/0243357 A1* | 9/2012 | Yamauchi | G11C 11/5692 365/205 |

* cited by examiner

*Primary Examiner* — J. H. Hur
(74) *Attorney, Agent, or Firm* — Winston Hsu

(57) ABSTRACT

A memory system includes a control block, an antifuse voltage generator, an array voltage generator, and a memory array. The control block is used to output control signals to the memory array according to a memory control data signal. The antifuse voltage generator is used to output an antifuse control signal to the memory array according to a control signal and a driving voltage. The array voltage generator is used to output a selection signal and a following control signal to the memory array according a control signal. The memory array is coupled to the control block, the antifuse voltage generator, and the array voltage generator and configured to access data according to the first control signal, the antifuse control signal, the selection signal, and the following control signal. The first control signal comprises address information of the memory array.

20 Claims, 12 Drawing Sheets

MEMORY SYSTEM WITH SMALL SIZE ANTIFUSE CIRCUIT CAPABLE OF VOLTAGE BOOST

CROSS REFERENCE TO RELATED APPLICATIONS

This application claims the benefit of U.S. provisional application no. 62/206,828, filed Aug. 18, 2015.

BACKGROUND OF THE INVENTION

1. Field of the Invention

The present invention illustrates a memory system, and more particularly, the memory system with small size antifuse circuit having a capability of boosting voltage.

2. Description of the Prior Art

Non-volatile memory is a type of memory that retains information it stores even when no power is supplied to memory blocks. Some examples include magnetic devices, optical discs, flash memory, and other semiconductor-based memory topologies. Non-volatile memory can be categorized in electrically addressed systems (i.e., read-only memory) and mechanically addressed systems (i.e., hard disks, optical disc, magnetic tape, holographic memory, and such). Specifically, since non-volatile memory does not require its memory data to be periodically refreshed, it is commonly used for secondary storage or long-term consistent storage.

Generally, with advancement of techniques, a high density or high capacity-based non-volatile memory is required to facilitate big data accessibility. Thus, a voltage circuit with large size for driving the memory to operate in programing state or in reading state is essential. Even, when the memory is an antifuse-based memory which can programmable by using a ruptured process (i.e., for example, an antifuse transistor of a memory cell is ruptured and behaves as a MOS capacitor), an antifuse circuit with large size for driving the antifuse-based memory is also required. As a result, since the constraint of circuit size, the voltage circuit and/or the antifuse circuit cannot be placed to the optimal locations on the chip, leading to reduce flexibility or performance of design.

SUMMARY OF THE INVENTION

In an embodiment of the present invention, a memory system is disclosed. The memory system comprises a control block, an antifuse voltage generator, an array voltage generator, and a memory array. The control block comprises an input terminal configured to receive a memory control data signal, a first output terminal configured to output a first control signal, a second output terminal configured to output a second control signal, a third output terminal configured to output a third control signal, and a fourth output signal configured to output a fourth control signal. The antifuse voltage generator comprises a first input terminal coupled to the second output terminal of the control block and configured to receive the second control signal, a second input terminal configured to receive a driving voltage, and an output terminal configured to output an antifuse control signal. The array voltage generator comprises a first input terminal coupled to the third output terminal of the control block and configured to receive the third control signal, a second input terminal configured to receive the driving voltage, a first output terminal configured to output a selection signal, and a second output terminal configured to output a following control signal. The memory array is coupled to the control block, the antifuse voltage generator, and the array voltage generator and configured to access data according to the first control signal, the antifuse control signal, the selection signal, and the following control signal. The first control signal comprises address information of the memory array.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
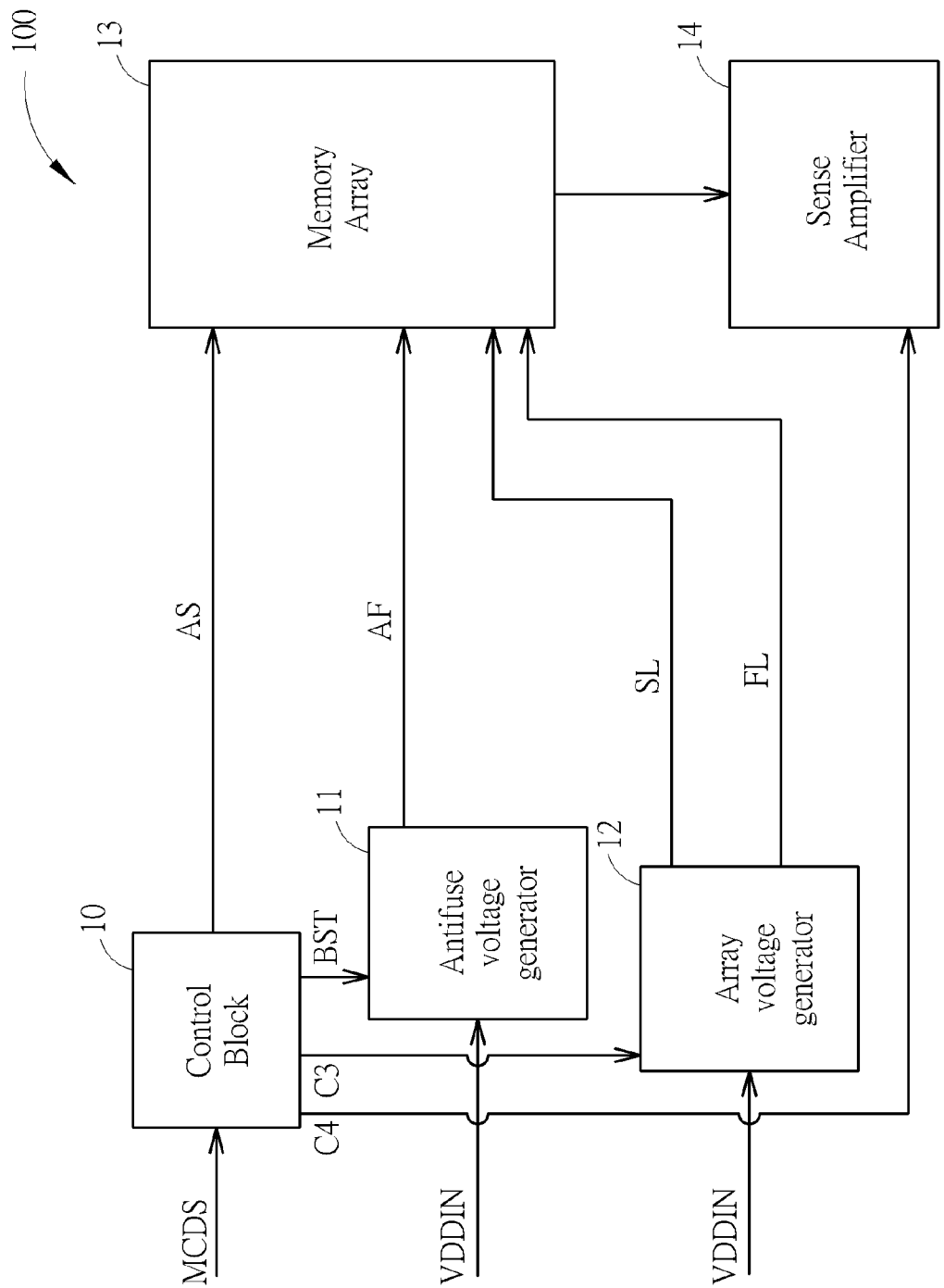
FIG. 1 illustrates a block diagram of a memory system according to an embodiment of the present invention.

FIG. 1 illustrates a block diagram of a memory system 100 according to an embodiment of the present invention. The memory system 100 includes a control block 10, an antifuse voltage generator 11, an array voltage generator 12, a memory array 13, and a sense amplifier 14. The control block includes an input terminal, a first output terminal, a second output terminal, a third output terminal, and a fourth output terminal. The input terminal is used for receiving a memory control data signal MCDS. Specifically, the memory control data signal MCDS can be an external data signal bearing all information of the memory system 100, such as address information of the memory array 13, all configurations information, driving information, and operation modes information. The memory control data signal MCDS can also be a user-defined data signal. The first output terminal is used for outputting a first control signal AS. The first control signal AS can carry address information of the memory array 13 so that specific memory cells located on specific addresses of the memory array 13 can be enabled accordingly. The second output terminal is used for outputting a second control signal BST. The third output terminal is used for outputting a third control signal C3. The fourth output signal is used for outputting a fourth control signal C4. The antifuse voltage generator 11 includes a first input terminal, a second input terminal, and an output terminal. The first input terminal is coupled to the second output terminal of the control block 10 for receiving the second control signal BST. The second input terminal is used for receiving a driving voltage VDDIN. The output terminal is used for outputting an antifuse control signal AF. The array voltage generator 12 includes a first input terminal, a second input terminal, a first output terminal, and a second output terminal. The first input terminal is coupled to the third output terminal of the control block 10 for receiving the third control signal C3. The second input terminal is used for receiving the driving voltage VDDIN. The first output terminal is used for outputting a selection signal SL. The second output terminal is used for outputting a following control signal FL. The memory array 13 is coupled to the control block 10, the antifuse voltage generator 11, and the array voltage generator 12 for accessing data according to the first control signal AS, the antifuse control signal AF, the selection signal SL, and the following control signal FL. Particularly, the memory array 13 can be a non-volatile memory cell array. The memory array 13 includes a plurality of memory cells. Each memory cell can perform reading operation and programming operation. Further, the sense amplifier 14 is coupled to the fourth terminal of the control block 10 and the memory array 13 for detecting and comparing a bit line current of the memory array 13 with a reference current. In the following, a structure of the memory cell and a method for driving the memory cell during reading operation and programming operation are described.

Figure 2:
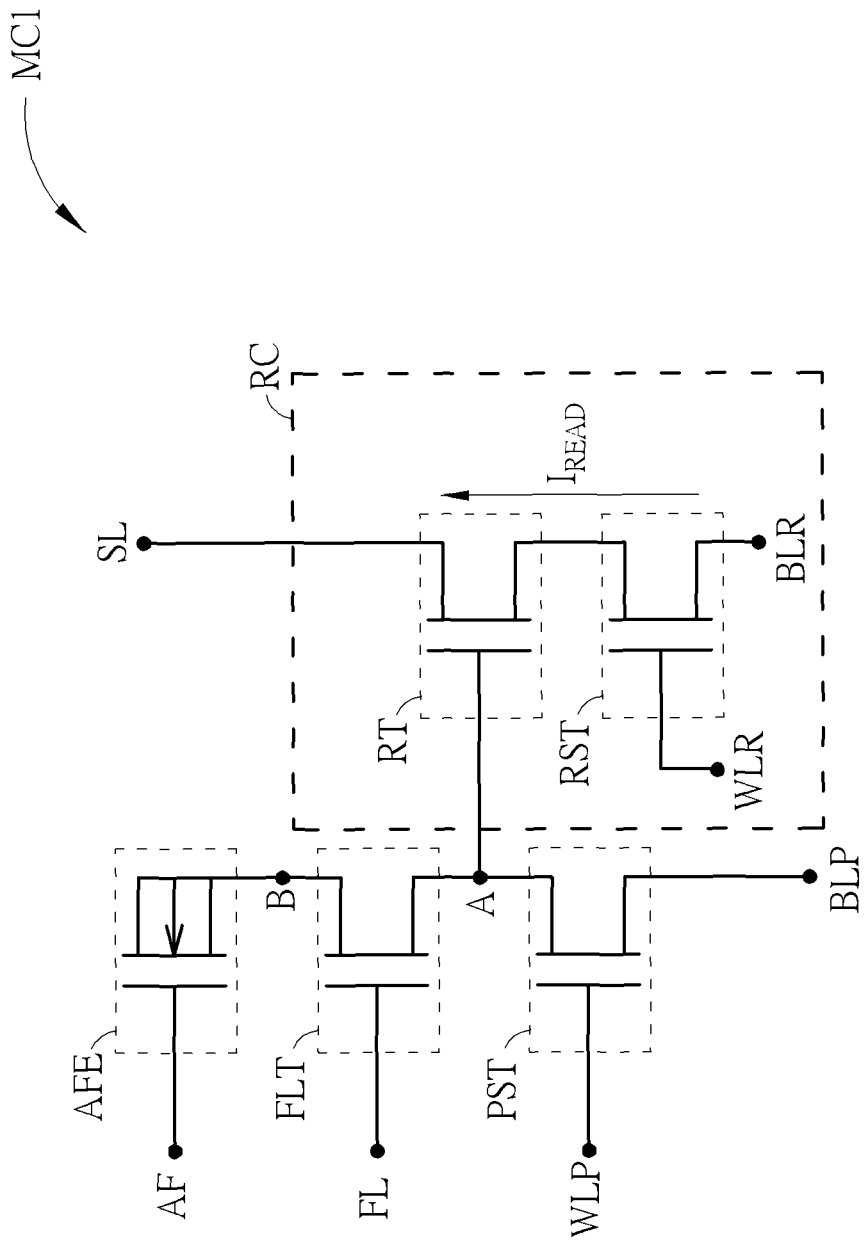
FIG. 2 illustrates a structure of a memory cell of a memory system in FIG. 1.

FIG. 2 illustrates a structure of a memory cell MC1 of the memory system 100. The memory cell MC1 can be four transistors and one varactor-based (4T1V) memory cell. Specifically, the memory cell MC1 includes a programming selection transistor PST, a following gate transistor FLT, an antifuse element AFE, and a reading circuit RC. The programming selection transistor PST includes a first terminal, a second terminal, and a control terminal. The second terminal is used for receiving a bit line program signal BLP. The control terminal is used for receiving a word line program signal WLP. The following gate transistor FLT includes a first terminal, a second terminal, and a control terminal. The second terminal is coupled to the first terminal of the programming selection transistor PST. The control terminal is used for receiving the following control signal FL. The antifuse element AFE includes a first terminal and a second terminal. The first terminal is used for receiving the antifuse control signal AF. The second terminal is coupled to the first terminal of the following gate transistor FLT. The reading circuit RC is coupled to the second terminal of the following gate transistor FLT for forming a read current $I_{READ}$ according to a bit line read signal BLR, a word line read signal WLR, and the selection signal SL during a reading operation of the memory cell MC1. Here, the antifuse element AFE can be a varactor. The following gate transistor FLT can be implemented by a native device, a short channel device or a varactor. Specifically, the reading circuit RC can be regard as an auxiliary circuit in order to improve driving performance during the reading operation of the memory cell MC1. The operation of the reading circuit RC is illustrated later. In the memory cell MC1, the reading circuit RC includes a reading transistor RT and a read selection transistor RST. The reading transistor includes a first terminal, a second terminal, and a control terminal. The first terminal is used for receiving the selection signal SL. The control terminal is coupled to the second terminal of the following gate transistor FLT. The read selection transistor RST includes a first terminal, a second terminal, and a control terminal. The first terminal is coupled to the second terminal of the reading transistor RT. The second terminal is used for receiving the bit line read signal BLR. The control terminal is used for receiving the word line read signal WLR. In the memory cell MC1, the programming selection transistor PST, the following gate transistor FLT, the reading transistor RT, and the read selection transistor RST can be N-type metal-oxide-semiconductor field-effect transistors. The operations of the memory cell MC1 is illustrated below.

When the memory cell MC1 is operated in a reading mode, the bit line program signal BLP is at a second voltage equal to 0 volt. The word line program signal WLP changes from a first voltage VDD to the second voltage (0V). Here, the first voltage VDD can be a predetermined circuit voltage greater than 0 volt (i.e., for example, the first voltage VDD can be 1 volt). The following control signal FL is at the first voltage VDD. The antifuse control signal AF is at the first voltage VDD. The bit line read signal BLR is at the first voltage VDD. The selection signal SL is at the second voltage (0V). The word line read signal WLR is at the first voltage VDD. Table A illustrates all signal statuses of the memory cell MC1 during the reading operation, as shown below.

TABLE A

| Mode | AF | FL | WLP | BLP | WLR | SL | BLR |
|---|---|---|---|---|---|---|---|
| Read | VDD | VDD | VDD to 0 V | 0 V | VDD | 0 V | VDD |

By doing so, the programming selection transistor PST is enabled and then disabled since the control terminal receives the word line program signal WLP from the first voltage VDD to 0V. Thus, an initial voltage of a node A is equal to 0V. The following gate transistor FLT is enabled since the control terminal receives the following control signal FL with the first voltage VDD. The read selection transistor RST is enabled since the control terminal receives the word line read signal WLR with the first voltage VDD. For presentation completeness, a reading mode with logic "0" and a reading mode with logic "1" are further illustrated as below.

When the memory cell MC1 is operated in the reading mode with logic "0", the antifuse element AFE is operated in a ruptured state and can be regarded as a resistor capable of conduction. Thus, the voltage of the node A is increased from a grounded voltage (0V) to (VDD-Vx) wherein Vx is a small offset voltage since the following gate transistor FLT is enabled. Once the voltage of the node A becomes (VDD-Vx), the reading transistor RT is also enabled since the control terminal receives a high voltage equal to (VDD-Vx). As a result, since the reading transistor RT and the read selection transistor RST are enabled, the read current $I_{READ}$ can be generated from a terminal of the bit line read signal BLR to a terminal of the selection signal SL.

When the memory cell MC1 is operated in the reading mode with logic "1", the antifuse element AFE is operated in a non-ruptured state and can be regarded as an insulator. Thus, the voltage of the node A is maintained around the grounded voltage (0V). Since the voltage of the node A is substantially equal to the grounded voltage (0V), the reading transistor RT is disabled. As a result, since the reading transistor RT is disabled, no read current $I_{READ}$ is introduced from the terminal of the bit line read signal BLR to the terminal of the selection signal SL.

Briefly, when the memory cell MC1 is operated in the reading mode with logic "0", the antifuse element AFE is operated in the ruptured state. Thus, the read current $I_{READ}$ is generated. When the memory cell MC1 is operated in the reading mode with logic "1", the antifuse element AFE is operated in the non-ruptured state. Thus, no read current $I_{READ}$ is generated.

Further, a programming mode with logic "0" and a programming mode with logic "1" are illustrated as below. When the memory cell MC1 is operated in a programming mode with logic "0", the bit line program signal BLP is at a second voltage equal to 0 volt. The word line program signal WLP is at a first voltage VDD. Here, the first voltage VDD can be a predetermined circuit voltage greater than 0 volt (i.e., for example, the first voltage VDD can be 1 volt). The following control signal FL is at a voltage level between the first voltage VDD and a third voltage VPP. For example, the following control signal FL can be at half of the third voltage VPP. Here, the third voltage VPP is greater than the first voltage VDD. For example, the third voltage VPP can be 7 volts. The antifuse control signal AF is at the third voltage VPP. The bit line read signal BLR is at the first voltage VDD. The selection signal SL is at the first voltage VDD. The word line read signal WLR is at the first voltage VDD. By doing so, the programming selection transistor PST is enabled since the control terminal receives the word line program signal with the first voltage VDD (i.e., the cross voltage Vgs between the control terminal and the second terminal is substantially equal to the first voltage VDD). Since the programming selection transistor PST is enabled, a voltage of a node A is equal to 0 volt (i.e., bit line program signal BLP is equal to 0 volt). Here, the following gate transistor FLT is enabled since the control terminal receives the following control signal FL with the voltage VPP/2 greater than first voltage VDD. Thus, since the following gate transistor FLT is enabled, a voltage of a node B is equal to the voltage of the node A at 0 volt (i.e., node A and node B become two grounded terminals equivalently). As a result, a cross voltage between a first terminal and a second terminal of the antifuse element AFE is substantially equal to the third voltage VPP. A circuit loop for rupturing the antifuse element AFE exists. For example, when the third voltage VPP is designed as 7 volts, the cross voltage of the antifuse element AFE is high enough for triggering a rupture process of the antifuse element AFE.

When the memory cell MC1 is operated in a programming mode with logic "1", voltages of the antifuse control signal AF, the following control signal FL, the word line program signal WLP, the bit line read signal BLR, the word line read signal WLR, and the selection signal SL are similar to the programming mode with logic "0". The difference is that the bit line program signal BLP is at the first voltage VDD. By doing so, the programming selection transistor PST may be disabled since the cross voltage between a source and a drain terminals is too small. As a result, a circuit loop for rupturing the antifuse element AFE does not exist. No rupture process of the antifuse element AFE is triggered.

Table B illustrates all signal statuses of the memory cell MC1 during the programming operation, as shown below.

TABLE B

| Mode | AF | FL | WLP | BLP | WLR | SL | BLR |
|---|---|---|---|---|---|---|---|
| Program | VPP | VPP/2 | VDD | 0 V (logic "0")<br>VDD (logic "1") | VDD | VDD | VDD |

Figure 3:
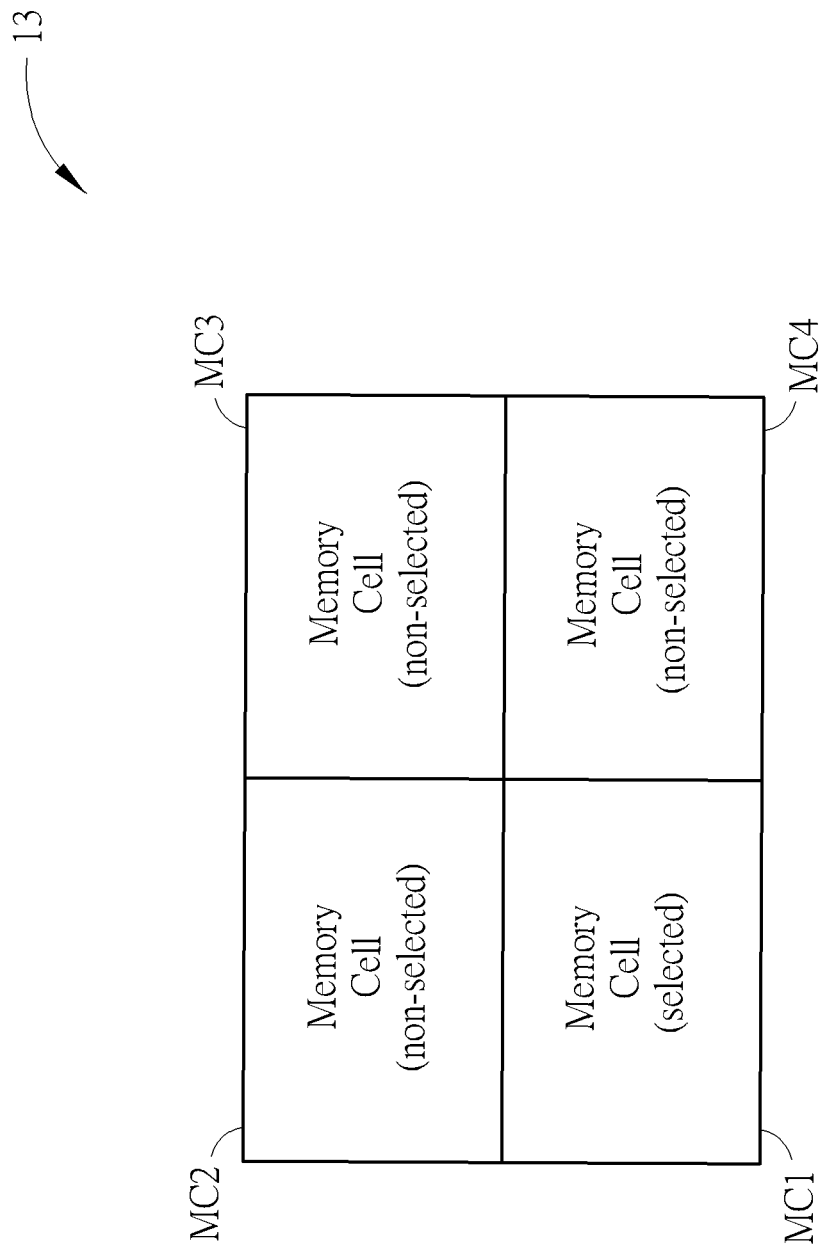
FIG. 3 illustrates a schematic diagram of memory cell allocation on a memory array of the memory system in FIG. 1.

As aforementioned structure, the memory array 13 includes a plurality of memory cells. For example, the memory array 13 can include N×M memory cells, wherein N and M are two positive integers. For presentation simplicity, four memory cells are introduced to the memory array 13. FIG. 3 illustrates a schematic diagram of memory cell allocation on the memory array 13. Here, the memory array 13 includes a memory cell MC1, a memory cell MC2, a memory cell MC3, and a memory cell MC4. All memory cells have a same circuit structure illustrated in FIG. 2. Specifically, according to the first control signal AS bearing address information, the memory cell MC1 is selected for driving the reading operation or the programming operation. The memory cell MC2, the memory cell MC3, and the memory cell MC4 can regarded as non-selected memory cells. In other words, when the memory cell MC1 is operated in reading mode, the memory cell MC2, the memory cell MC3, and the memory cell MC4 are operated in reading inhibit mode. When the memory cell MC1 is operated in programming mode, the memory cell MC2, the memory cell MC3, and the memory cell MC4 are operated in programming inhibit mode. For presentation completeness, when the memory cell MC1 is driven, all signals of the memory cell MC1 to the memory cell MC4 are listed in Table C and Table D. Here, Table C illustrated signal statuses of the memory array 13 when the memory cell MC1 is operated under reading mode, while the memory cells MC2 to MC4 are operated under the reading inhibit mode.

TABLE C

| Mode | AF | FL | WLP | BLP | WLR | SL | BLR |
|---|---|---|---|---|---|---|---|
| MC1 (reading) | VDD | VDD | VDD to 0 V | 0 V | VDD | 0 V | VDD |
| MC2 (reading inhibit) | VDD | VDD | 0 V | 0 V | 0 V | 0 V | VDD |
| MC3 (reading inhibit) | VDD | VDD | 0 V | 0 V | 0 V | 0 V | 0 V |
| MC4 (reading inhibit) | VDD | VDD | VDD to 0 V | 0 V | VDD | 0 V | 0 V |

Further, Table D illustrated signal statuses of the memory array 13 when the memory cell MC1 is operated under programming mode, while the memory cells MC2 to MC4 are operated under the programming inhibit mode.

TABLE D

| Mode | AF | FL | WLP | BLP | WLR | SL | BLR |
|---|---|---|---|---|---|---|---|
| MC1 (programming) | VPP | VPP/2 | VDD | 0 V(logic "0")<br>VDD(logic "1") | VDD | VDD | VDD |
| MC2 (programming inhibit) | VPP | VPP/2 | 0 V | 0 V | 0 V | VDD | VDD |
| MC3 (programming inhibit) | VPP | VPP/2 | 0 V | VDD | 0 V | VDD | VDD |

TABLE D-continued

| Mode | AF | FL | WLP | BLP | WLR | SL | BLR |
|---|---|---|---|---|---|---|---|
| MC4 (programming inhibit) | VPP | VPP/2 | VDD | VDD | VDD | VDD | VDD |

In the memory system 100, since two operation modes (i.e., the reading mode and the programming mode) are introduced, an appropriate antifuse voltage generator 11 is required for outputting a corresponding antifuse control signal AF. For example, when the memory cell MC1 is enabled during reading operation, the antifuse control signal AF is at a voltage level equal to the first voltage VDD (i.e., 1 volt). When the memory cell MC1 is enabled during programming operation, the antifuse control signal AF is at a voltage level equal to the third voltage VPP (i.e., 7 volts). In the following, a structure of the antifuse voltage generator is described.

Figure 4:
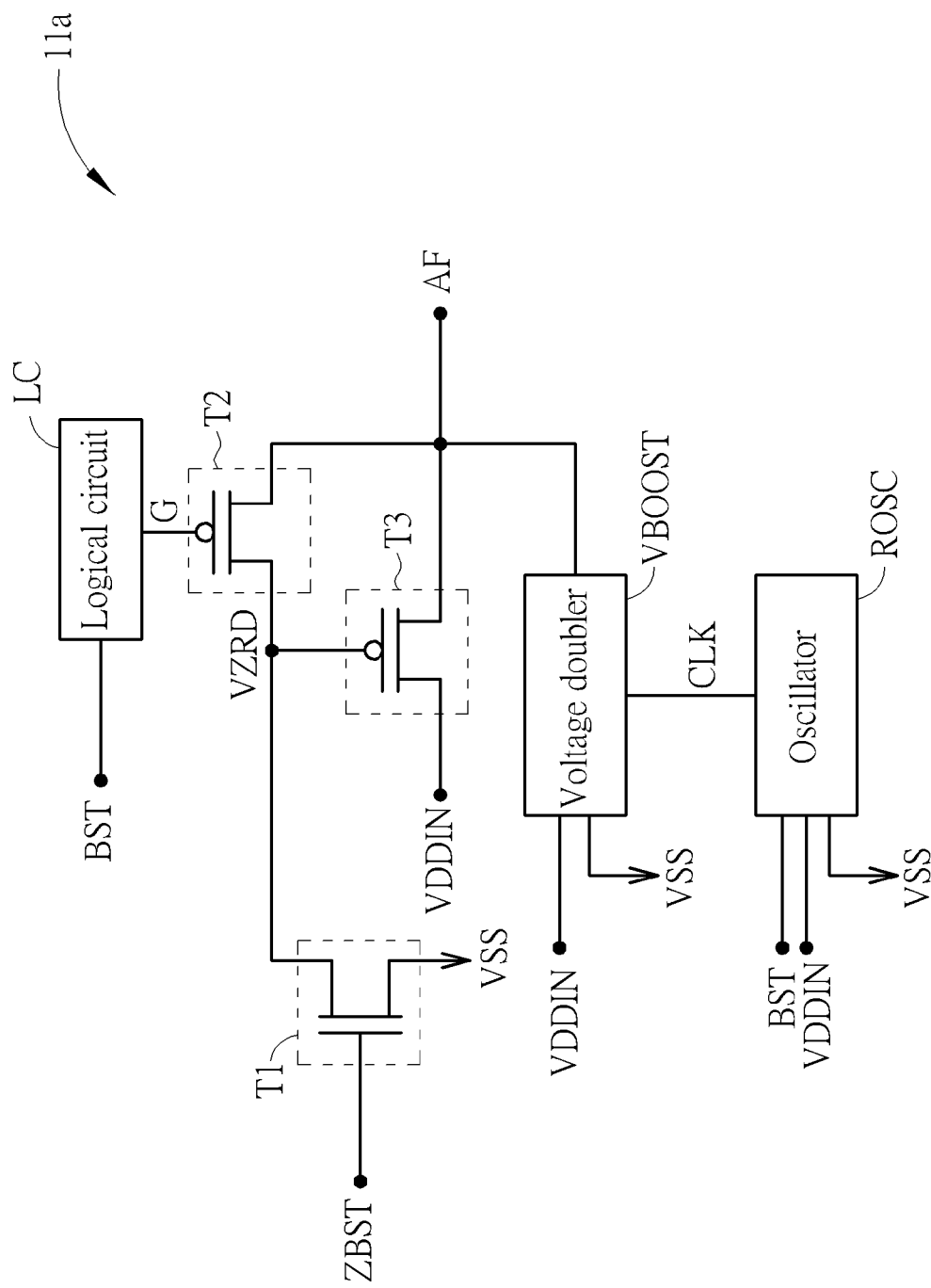
FIG. 4 illustrates a structure of an antifuse voltage generator of the memory system in FIG. 1.

FIG. 4 illustrates a structure of the antifuse voltage generator 11a. The antifuse voltage generator 11a can be applied to the antifuse voltage generator 11 of the memory system 100. The antifuse voltage generator 11a includes an oscillator ROSC, a voltage doubler VBOOST, a first transistor T1, a second transistor T2, and a third transistor T3. The oscillator ROSC includes a first input terminal, a second input terminal, a third input terminal, and an output terminal. The first input terminal is used for receiving the second control signal BST. The second input terminal is used for receiving the driving voltage VDDIN. The third input terminal is used for receiving a second voltage VSS. The output terminal is used for outputting a clock signal CLK. Here, the oscillator ROSC can be any typed oscillator, such as a ring oscillator. The voltage doubler VBOOST includes a first input terminal, a second input terminal, a third input terminal, and an output terminal. The first input terminal is used for receiving the driving voltage VDDIN. The second input terminal is used for receiving the second voltage VSS. The third input terminal is coupled to the output terminal of the oscillator ROSC for receiving the clock signal CLK. The output terminal is used for outputting the antifuse control signal AF during a programming operation. The first transistor T1 includes a first terminal, a second terminal, and a control terminal. The first terminal is used for receiving the second voltage VSS. The control terminal is used for receiving an inverse signal ZBST of the second control signal BST. The second transistor T2 includes a first terminal, a second terminal, and a control terminal. The first terminal is coupled to the second terminal of the first transistor T1. The second terminal is coupled to the output terminal of the voltage doubler VBOOST. The control terminal is used for receiving a gate signal G through a logical circuit LC according to the second control signal BST. The logical circuit LC can be a delay logical circuit. The third transistor T3 includes a first terminal, a second terminal, and a control signal. The first terminal is used for receiving the driving voltage VDDIN. The second terminal is coupled to the second terminal of the second transistor T2 for outputting the antifuse control signal AF during a reading operation. The control signal is coupled to the first terminal of the second transistor T2. In the antifuse voltage generator 11a, the driving voltage VDDIN is higher than the second voltage VSS. For example, the driving voltage VDDIN can be equal to 1 volt or 3.5 volts. The second voltage VSS can be a grounded voltage equal to 0 volt. The first transistor T1 can be an N-type metal-oxide-semiconductor field-effect transistor. The second transistor T2 and the third transistor T3 can be P-type metal-oxide-semiconductor field-effect transistors. The driving modes of the antifuse voltage generator 11a during the reading operation and the programming operation of the memory array 13 are illustrated below.

Figure 5:
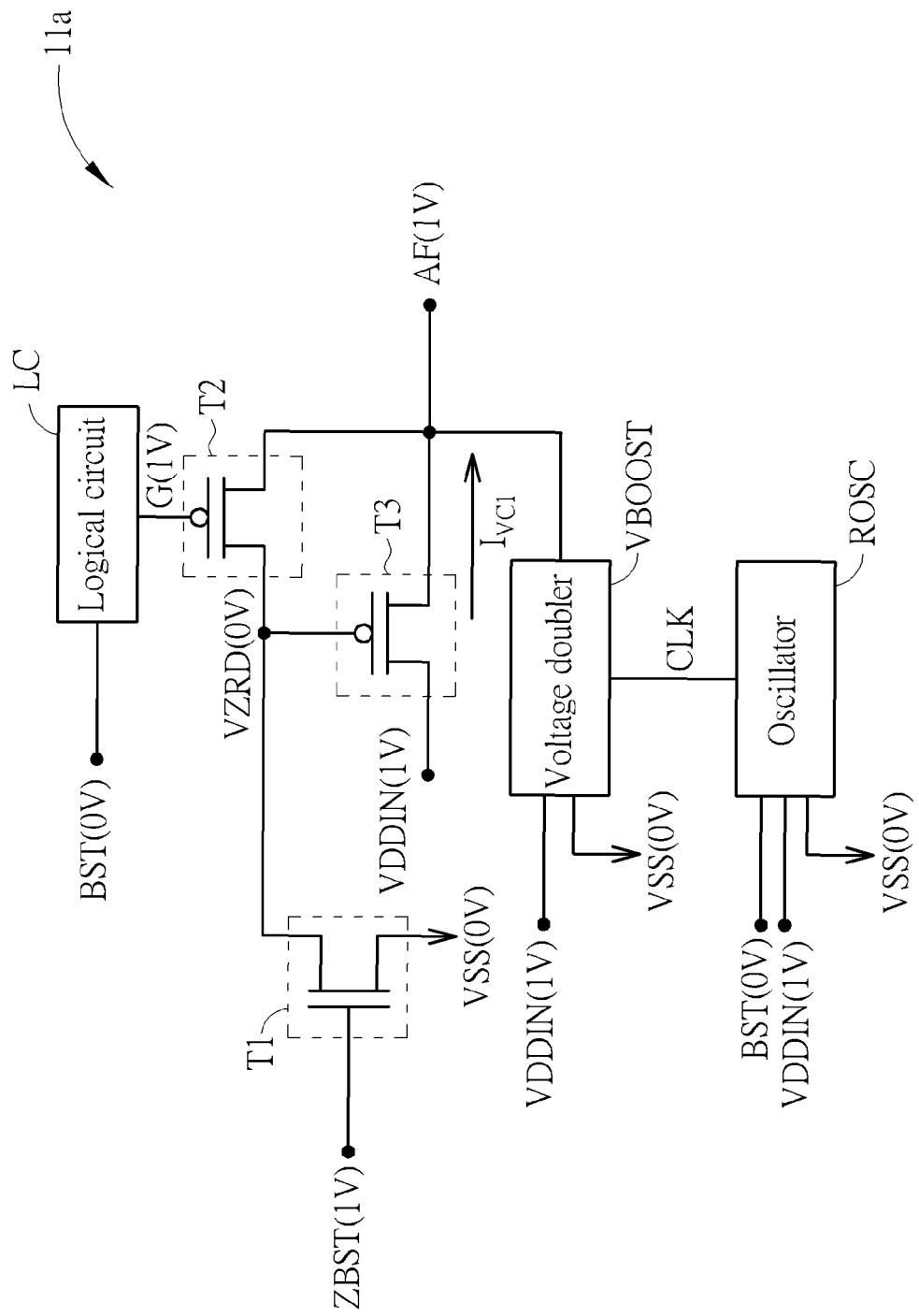
FIG. 5 illustrates a schematic diagram of the antifuse voltage generator in FIG. 4 during a reading operation.

FIG. 5 illustrates a schematic diagram of the antifuse voltage generator 11a during a reading operation. Here, the second voltage VSS is equal to a grounded voltage (0 volt). The second control signal BST is equal to the grounded voltage (0 volt). The inverse signal ZBST of the second control signal BST is equal to a first voltage VDD (1 volt). The gate signal G is equal to the driving voltage VDDIN (1 volt). The antifuse control signal AF is equal to the driving voltage (1 volt). All signal statuses of the antifuse voltage generator 11a during the reading operation can be listed in Table E.

TABLE E

| Mode | VDDIN | VSS | AF | BST | ZBST | G |
|---|---|---|---|---|---|---|
| Reading | 1 V | 0 V | 1 V | 0 V | 1 V(VDD) | 1 V(VDDIN) |

The operation mode of the antifuse voltage generator 11a can be illustrated below. During the reading operation, since the voltage doubler VBOOST receives the driving voltage VDDIN equal to 1 volt, the clock signal CLK is fixed at a level equal to 0 volt or 1 volt, the voltage doubler VBOOST is disabled and can be regarded as a void device. Thus, the output terminal of the voltage doubler VBOOST becomes a floating terminal. Further, since the control terminal of the first transistor T1 receives the inverse signal ZBST of the second control signal BST equal to 1 volt, the first transistor T1 is enabled. Thus, a voltage of a node VZRD is equal to 0 volt (the second voltage VSS). Since the control terminal of the second transistor T2 receives the gate signal G equal to 1 volt, the second transistor T2 is disabled. Specifically, since the control terminal of the third transistor T3 receives the voltage of the node VZRD equal to 0 volt, the third transistor T3 is enabled. As a result, a voltage of the antifuse control signal AF is equal to the driving voltage VDDIN (1V) received by the first terminal of the third transistor T3 since a current $I_{VC1}$ can be formed from the first terminal to the second terminal of the third transistor T3. By doing so, since the antifuse control signal AF with 1 volt can be outputted from the antifuse voltage generator 11a during the reading operation (or say, a time interval of reading operation), the memory array 13 can be operated correctly.

Figure 6:
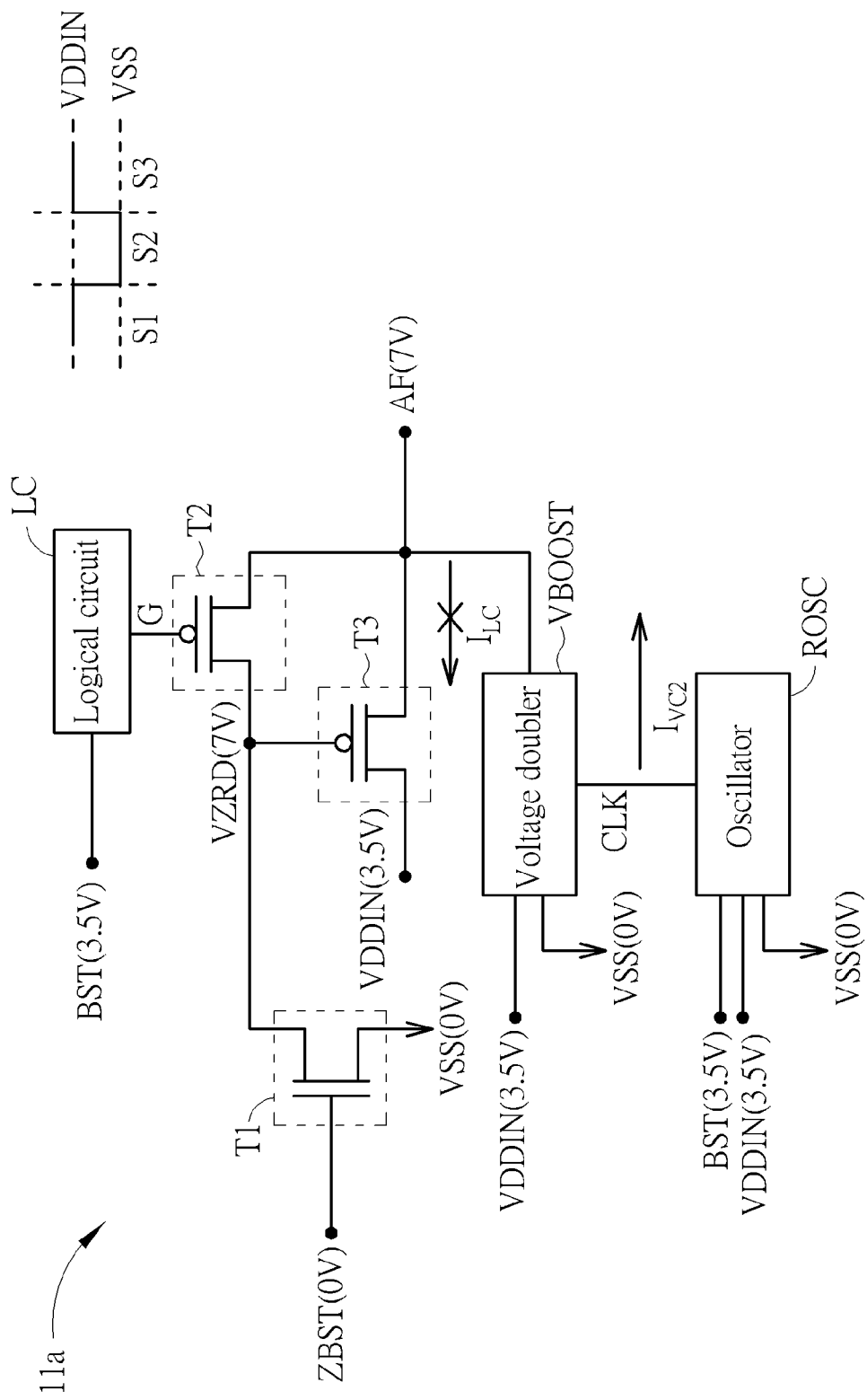
FIG. 6 illustrates a schematic diagram of the antifuse voltage generator in FIG. 4 during a programming operation.

FIG. 6 illustrates a schematic diagram of the antifuse voltage generator 11a during a programming operation. Here, the second voltage VSS is equal to a grounded voltage (0 volt). The second control signal BST is equal to 3.5 volts. The inverse signal ZBST of the second control signal BST is equal to the grounded voltage (0 volt). The gate signal G is changed from the driving voltage VDDIN (3.5 volts) to the grounded voltage (0 volt). The gate signal G can be further changed from the grounded voltage (0 volt) to the driving voltage VDDIN (3.5 volt) after the gate signal G is changed from the driving voltage VDDIN (3.5 volt) to the grounded voltage (0 volt). The antifuse control signal AF is equal to two times of the driving voltage VDDIN (i.e., 7 volts). All signal statuses of the antifuse voltage generator 11a during the programming operation can be listed in Table F.

TABLE F

| Mode | VDDIN | VSS | AF | BST | ZBST | G |
| --- | --- | --- | --- | --- | --- | --- |
| Programming | 3.5 V | 0 V | 7 V | 3.5 V (VDDIN) | 0 V | VDDIN to 0 V to VDDIN |

In other words, for the antifuse voltage generator 11a during a programming operation, the gate signal G follows three states. In an initial state, a voltage of the gate signal G is equal to the driving voltage VDDIN (3.5 volt) during a time interval S1. In an operation state, the voltage of the gate signal G is equal to the second voltage VSS (0 volt) during a time interval S2. In a final state, the voltage of the gate signal G is equal to the driving voltage VDDIN (3.5 volt) during a time interval S3. When the antifuse voltage generator 11a is operated from the reading operation to the programming operation, the voltage of the gate signal G is changed from the initial state to the operation state. Specifically, when the voltage of the gate signal G is equal to the second voltage VSS (0 volt), the operation mode of the antifuse voltage generator 11a can be illustrated below. Since the voltage doubler VBOOST receives the driving voltage VDDIN equal to 3.5 volt, the clock signal CLK toggles between 3.5 volt and 0 volt. Thus, the voltage doubler VBOOST is enabled and can generate the antifuse control signal AF equal to two times of the driving voltage VDDIN (7 volts) according to the clock signal CLK generated from the oscillator ROSC. Here, since the control terminal of the first transistor T1 receives the inverse signal ZBST of the second control signal BST equal to 0 volt, the first transistor T1 is disabled. Since the control terminal of the second transistor T2 receives the gate signal G equal to 0 volt, the second transistor T2 is enabled. Thus, a voltage of a node VZRD is equal to 7 volts (i.e., voltage of the antifuse control signal AF). Further, since the control terminal of the third transistor T3 receives the voltage of the node VZRD equal to 7 volts, the third transistor T3 is disabled. As a result, since the third transistor T3 is disabled, a leakage current $I_{LC}$ from the second terminal (7 volt) to the first terminal (3.5 volts) of the third transistor T3 is disappeared. By doing so, since the antifuse control signal AF with 7 volts can be outputted from the antifuse voltage generator 11a during the programming operation (or say, a time interval of programming operation), the memory array 13 can be operated correctly.

Briefly, when the antifuse voltage generator 11a is enabled during a reading operation, the antifuse control signal AF is outputted with the voltage level equal to 1 volt according to the current $I_{VC1}$ generated from the third transistor T3. When the antifuse voltage generator 11a is enabled during a programming operation, the antifuse control signal AF is outputted with the voltage level equal to 7 volts according to a current $I_{VC2}$ generated from the voltage doubler VBOOST. In FIG. 6, the antifuse voltage generator 11a can output the antifuse control signal AF with the voltage level equal to 7 volts during a time interval S2. Then, the gate signal G can remain to a signal with a voltage level equal to 0 volt. The gate signal G can also be changed as a signal with a voltage level equal to 3.5 volts during a time interval S3. In the following, effects of the transistors of the antifuse voltage generator 11a for different final states of the gate signal G are illustrated.

Figure 7:
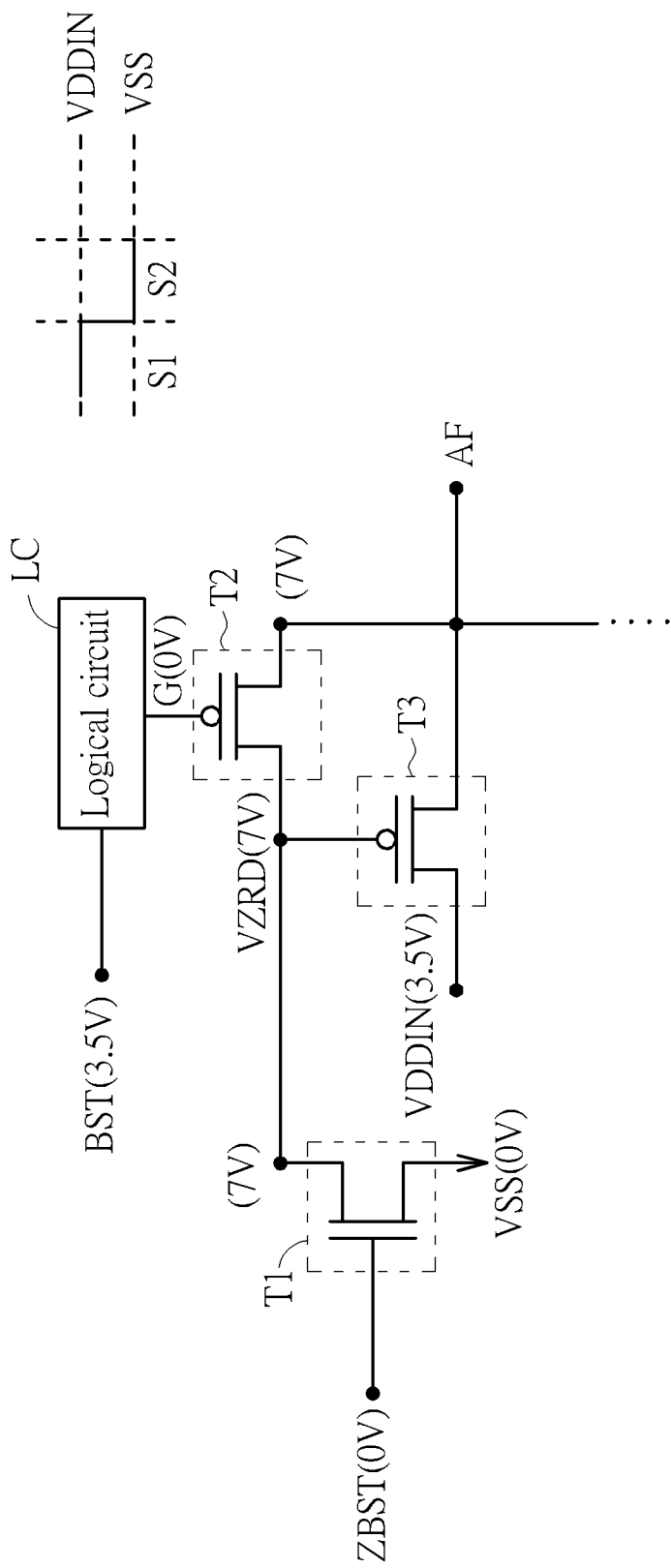
FIG. 7 illustrates a schematic diagram of cross voltages of transistors of the antifuse voltage generator in FIG. 6 at a pull-low gate signal.

FIG. 7 illustrates a schematic diagram of cross voltages of transistors T1 to T3 of the antifuse voltage generator 11a at a pull-low gate signal G. Here, the pull-low gate signal G is defined as a gate signal during a time interval S2. As aforementioned operation in FIG. 6, the first transistor T1 is disabled. The second transistor T2 is enabled. The third transistor T3 is disabled. As a result, a cross voltage between the first terminal and the control terminal of the first transistor T1 is equal to 0 volt. A cross voltage between the second terminal and the control terminal of the first transistor T1 is equal to 7 volts. Thus, the first transistor T1 suffers high cross voltage effect, leading to reduce lifetime. A cross voltage between the first terminal and the control terminal of the second transistor T2 is equal to 7 volts. A cross voltage between the second terminal and the control terminal of the second transistor T2 is equal to 7 volts. Thus, the second transistor T2 suffers high cross voltage effect, leading to reduce lifetime. A cross voltage between the first terminal and the control terminal of the third transistor T3 is equal to 3.5 volts. A cross voltage between the second terminal and the control terminal of the third transistor T3 is equal to 0 volts. Thus, no high cross voltage effect is introduced to the third transistor T3. As a result, when the gate signal G becomes the pull-low gate signal and remains a pull-low status, high cross voltage effect is introduced to the first transistor T1 and the second transistor T2. In other words, although the operations of the antifuse voltage generator 11a in FIG. 7 can provide the voltage level (7 volts) of the antifuse control signal AF during programming operation, lifetimes of the first transistor T1 and the second transistor T2 may be reduced due to the high cross voltage effect.

Figure 8:
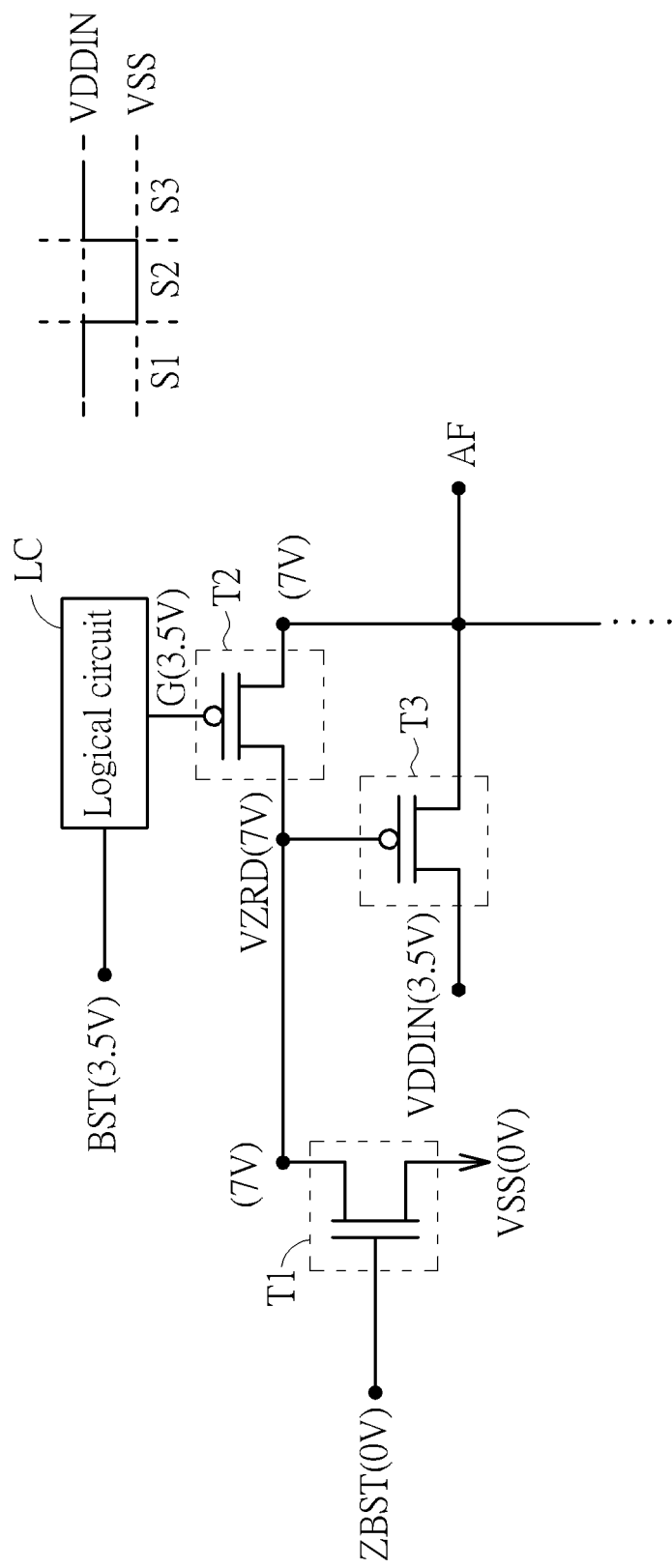
FIG. 8 illustrates a schematic diagram of cross voltages of transistors of the antifuse voltage generator in FIG. 6 at a pull-high gate signal.

FIG. 8 illustrates a schematic diagram of cross voltages of transistors T1 to T3 of the antifuse voltage generator 11a at a pull-high gate signal G. Here, the pull-high gate signal G is defined as a gate signal during a time interval S3. Here, the first transistor T1 is disabled since the control terminal receives the inverse signal ZBST of the second control signal BST equal to 0 volt. Thus, a cross voltage between the first terminal and the control terminal of the first transistor T1 is equal to 0 volt. A cross voltage between the second terminal and the control terminal of the first transistor T1 is equal to 7 volts (i.e., a transient voltage of the second terminal is equal to 7 volts). Thus, the first transistor T1 suffers high cross voltage effect, leading to reduce lifetime. A cross voltage between the first terminal and the control terminal of the second transistor T2 is equal to 3.5 volts. A cross voltage between the second terminal and the control terminal of the second transistor T2 is equal to 3.5 volts. Thus, no high cross voltage effect is introduced to the second transistor T2. A cross voltage between the first terminal and the control terminal of the third transistor T3 is equal to 3.5 volts. A cross voltage between the second terminal and the control terminal of the third transistor T3 is equal to 0 volts. Thus, no high cross voltage effect is introduced to the third transistor T3. As a result, when the gate signal G becomes the pull-high gate during the time interval S3, high cross voltage effect is introduced to the first transistor T1. In other words, although the operations of the antifuse voltage generator 11a in FIG. 7 can provide the voltage level (7 volts) of the antifuse control signal AF during programming operation, lifetimes of the first transistor T1 may be reduced due to the high cross voltage effect. Comparing with the operations in FIG. 7 and FIG. 8, at least one transistor with high cross voltage still exists. By avoiding high cross voltage effect, another antifuse voltage generator is introduced and illustrated as below.

Figure 9:
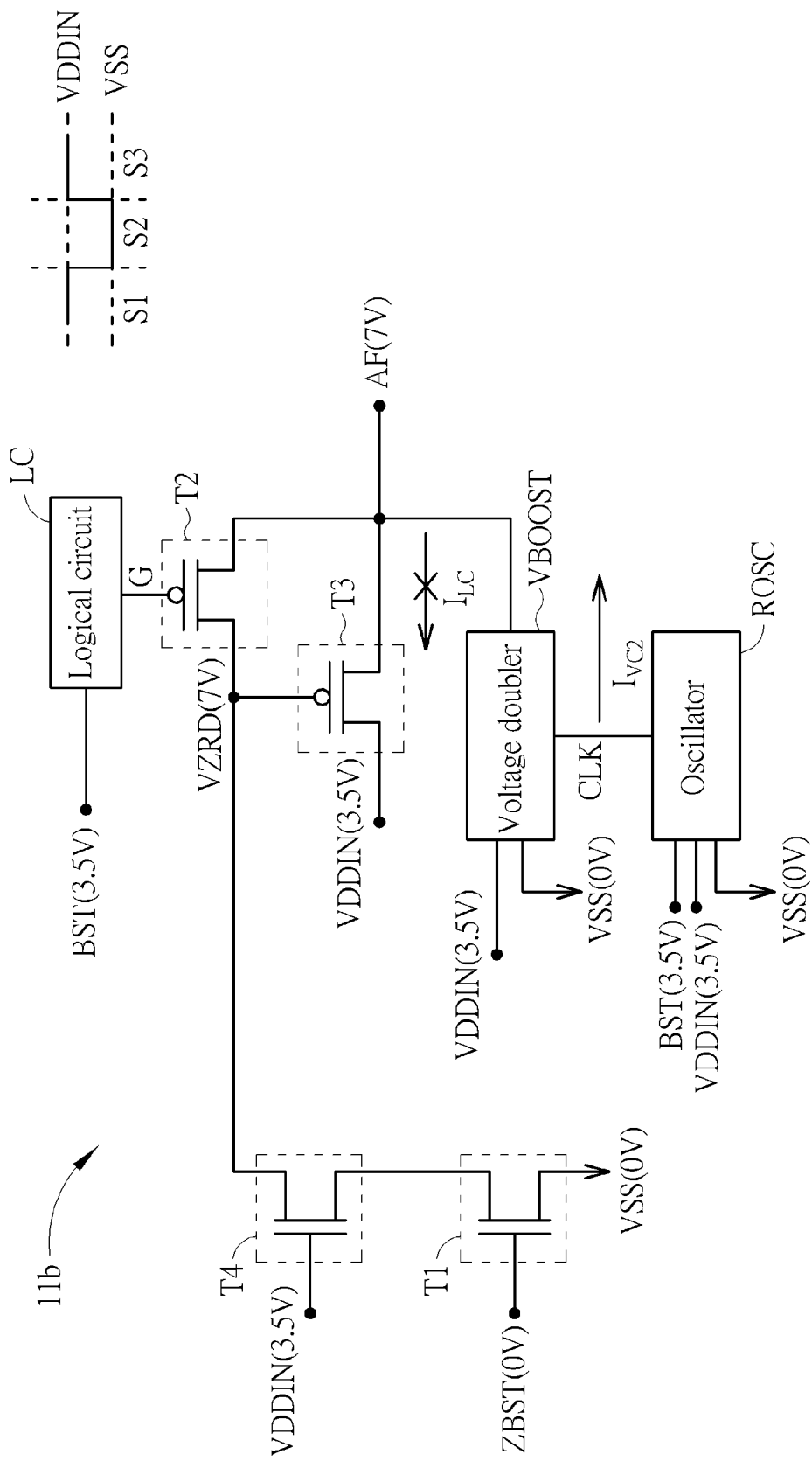
FIG. 9 illustrates another structure of an antifuse voltage generator of the memory system in FIG. 1 during a programming operation.

FIG. 9 illustrates another structure of an antifuse voltage generator 11b during a programming operation. The antifuse voltage generator 11b can be applied to the antifuse voltage generator 11 of the memory system 100. Specifically, a structure of the antifuse voltage generator 11b is similar to the structure of the antifuse voltage generator 11a. The difference is that an additional transistor T4 (i.e., hereafter, say "a fourth transistor T4") is introduced to the antifuse voltage generator 11b. Since an oscillator ROSC, a voltage doubler VBOOST, a first transistor T1, a second transistor T2, and a third transistor T3 of the antifuse voltage generator 11b are similar to the antifuse voltage generator 11a, illustrations of these components are omitted here. In the antifuse voltage generator 11b, the fourth transistor T4 includes a first terminal, a second terminal, and a control terminal. The first terminal is coupled to a second terminal of the first transistor T1. The second terminal is coupled to a first terminal of the second transistor T2. The control terminal is used for receiving the driving voltage VDDIN (3.5 volts). The fourth transistor T4 can be an N-type metal-oxide-semiconductor field-effect transistor. Specifically, the fourth transistor T4 is enabled since the control terminal receives the driving voltage VDDIN equal to 3.5 volts. Thus, since the fourth transistor T4 of the antifuse voltage generator 11b is always enabled during reading operation (i.e., VDDIN in equal to 1 volt) and during programming operation (i.e., VDDIN in equal to 3.5 volts), the driving methods for generating a corresponding antifuse control signal AF during reading operation and the programming operation are similar to the driving methods of the antifuse voltage generator 11a. Thus, these illustrations are also omitted here. In FIG. 9, similarly, the antifuse voltage generator 11b can output the antifuse control signal AF with the voltage level equal to 7 volts during a time interval S2. Then, the gate signal G can remain to a signal with a voltage level equal to 0 volt. The gate signal G can also be changed as a signal with a voltage level equal to 3.5 volts (VDDIN) during a time interval S3. In the following, effects of the transistors of the antifuse voltage generator 11b for different final states of the gate signal G are illustrated.

Figure 10:
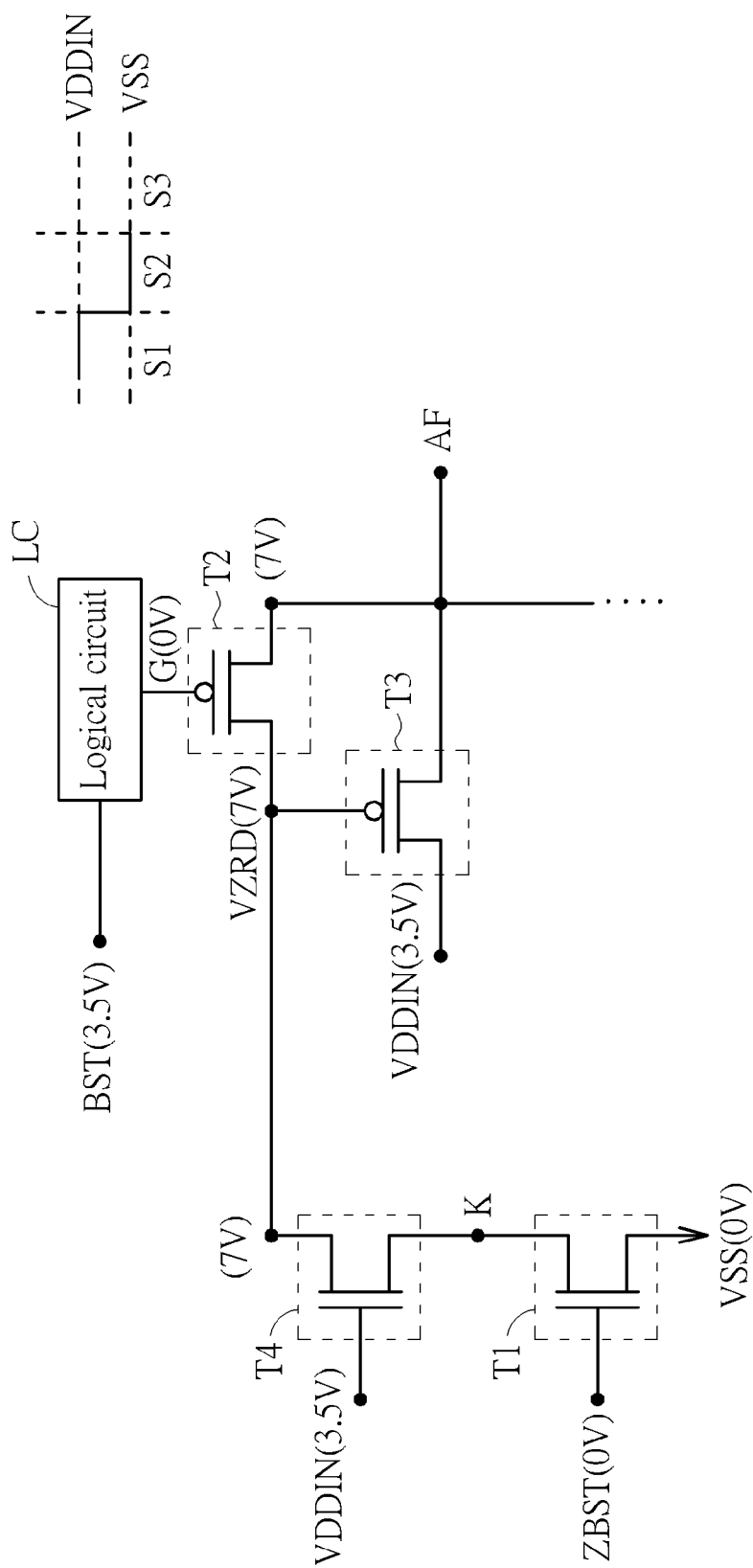
FIG. 10 illustrates a schematic diagram of cross voltages of transistors of the antifuse voltage generator in FIG. 9 at a pull-low gate signal.

FIG. 10 illustrates a schematic diagram of cross voltages of transistors T1 to T4 of the antifuse voltage generator 11b at a pull-low gate signal G. Here, the pull-low gate signal G is defined as agate signal during a time interval S2. As aforementioned operation, the first transistor T1 is disabled. The second transistor T2 is enabled. The third transistor T3 is disabled. The fourth transistor T4 is enabled. Note that a node K can be a voltage around (3.5-Vthn) volts, wherein Vthn can be a predetermined threshold voltage of T4. Thus, since no transient current is introduced to the first transistor T1 and the control terminal of the first transistor T1 receives the inverse signal ZBST of the second control signal BST equal to 0 volt, a cross voltage of the first transistor T1 is small. Thus, no high cross voltage effect is introduced to the first transistor T1. Across voltage between the first terminal and the control terminal of the fourth transistor T4 is equal to Vthn volts. A cross voltage between the second terminal and the control terminal of the fourth transistor T4 is equal to 3.5 volts. Thus, no high cross voltage effect is introduced to the fourth transistor T4. A cross voltage between the first terminal and the control terminal of the second transistor T2 is equal to 7 volts. A cross voltage between the second terminal and the control terminal of the second transistor T2 is equal to 7 volts. Thus, the second transistor T2 suffers high cross voltage effect. A cross voltage between the first terminal and the control terminal of the third transistor T3 is equal to 3.5 volts. A cross voltage between the second terminal and the control terminal of the third transistor T3 is equal to 0 volts. Thus, no high cross voltage effect is introduced to the third transistor T3. As a result, when the gate signal G becomes the pull-low gate signal and remains a pull-low status, high cross voltage effect is introduced to the second transistor T2. In other words, although the operations of the antifuse voltage generator 11b in FIG. 10 can provide the voltage level (7 volts) of the antifuse control signal AF during programming operation, lifetimes of the second transistor T2 may be reduced due to the high cross voltage effect, while the high cross voltage effect of the transistor T1 is mitigated.

Figure 11:
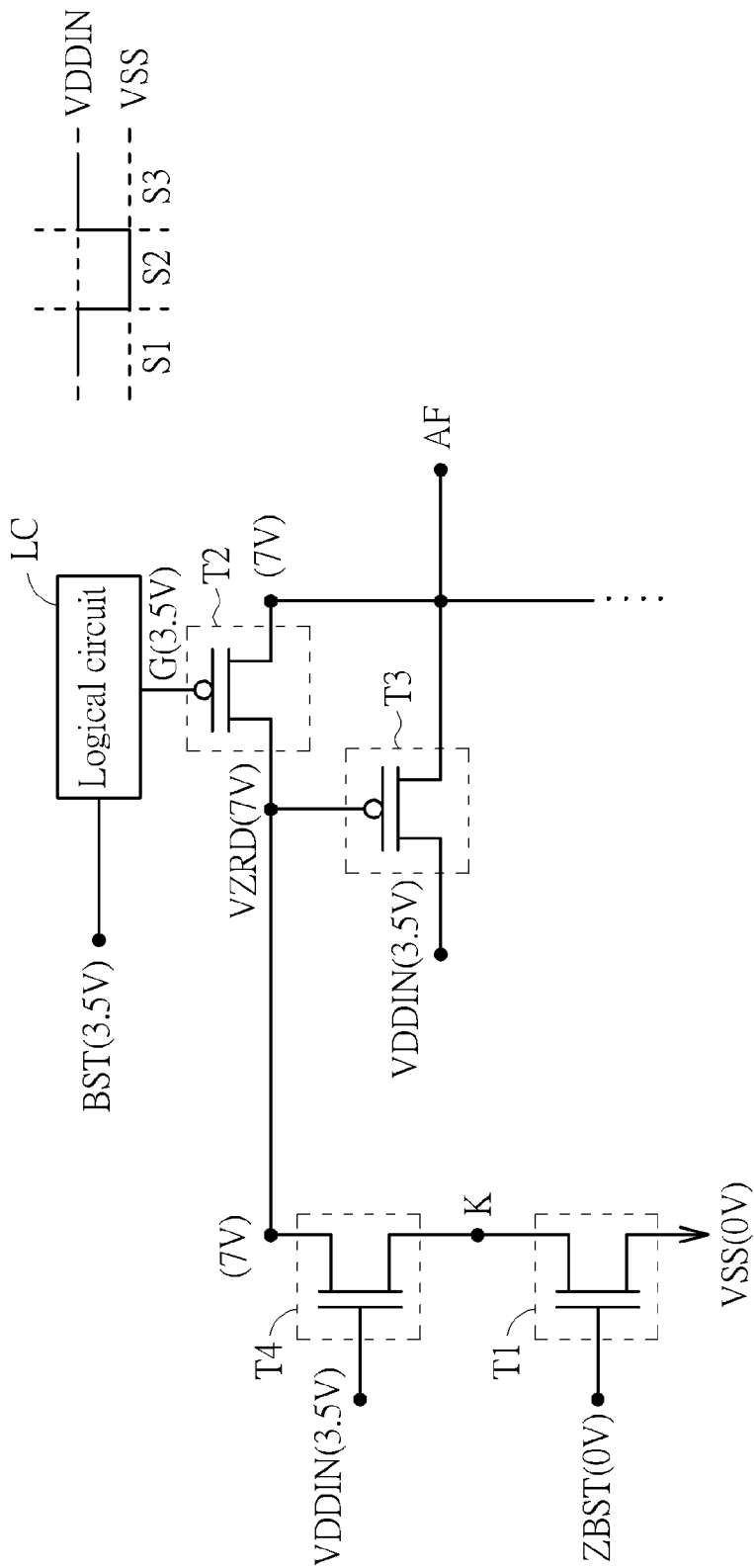
FIG. 11 illustrates a schematic diagram of cross voltages of transistors of the antifuse voltage generator in FIG. 9 at a pull-high gate signal.

FIG. 11 illustrates a schematic diagram of cross voltages of transistors T1 to T4 of the antifuse voltage generator 11b at a pull-high gate signal G. Here, the pull-high gate signal G is defined as agate signal during a time interval S3. Here, the first transistor T1 is disabled since the control terminal receives the inverse signal ZBST of the second control signal BST equal to 0 volt. Note that the first transistor T1 is disabled and operated under an open-circuit state. As a result, since no transient current is introduced to the first transistor T1 and the control terminal of the first transistor T1 receives the inverse signal ZBST of the second control signal BST equal to 0 volt, a cross voltage of the first transistor T1 is small. Thus, no high cross voltage effect is introduced to the first transistor T1. A cross voltage between the first terminal and the control terminal of the fourth transistor T4 is equal to 3.5 volts. Similar to a status of the fourth transistor T4 in FIG. 10, no high cross voltage effect is introduced to the fourth transistor T4 in FIG. 11. A cross voltage between the first terminal and the control terminal of the second transistor T2 is equal to 3.5 volts. A cross voltage between the second terminal and the control terminal of the second transistor T2 is equal to 3.5 volts. Thus, no high cross voltage effect is introduced to the second transistor T2. A cross voltage between the first terminal and the control terminal of the third transistor T3 is equal to 3.5 volts. A cross voltage between the second terminal and the control terminal of the third transistor T3 is equal to 0 volts. Thus, no high cross voltage effect is introduced to the third transistor T3. As a result, when the gate signal G becomes the pull-high gate during the time interval S3, no high cross voltage effect is introduced to the antifuse voltage generator 11b. In other words, the operations of the antifuse voltage generator 11b in FIG. 11 can provide the voltage level (7 volts) of the antifuse control signal AF during programming operation. All transistors T1 to T4 can also avoid high cross voltage effect. Thus, the lifetime of the antifuse voltage generator 11b can be spanned.

Figure 12:
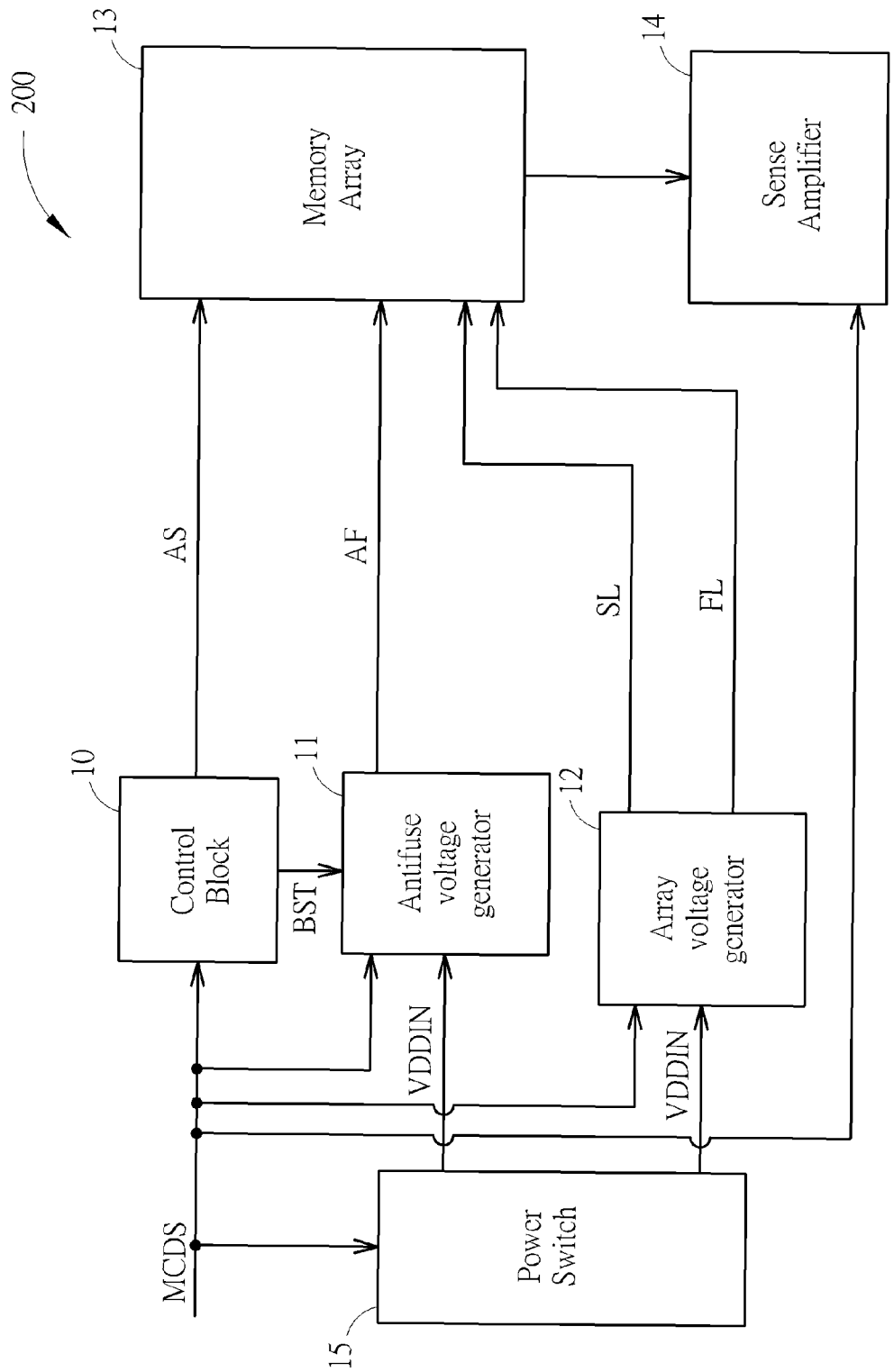
FIG. 12 illustrates a block diagram of a memory system according to another embodiment of the present invention.

Without loss of generality, another memory system with external power switch is introduced. FIG. 12 illustrates a block diagram of a memory system 200 according to another embodiment of the present invention. Particularly, the block diagram of the memory system 200 is similar to the block diagram of the memory system 100. The difference is that a power switch 15 is introduced to the memory system 200. The power switch 15 is coupled to an antifuse voltage generator 11 and an array voltage generator 12. In the memory system 200, the power switch 15 can generate a driving voltage VDDIN to the antifuse voltage generator 11 and the array voltage generator 12. Specifically, control information of the memory control data signal MCDS can be extracted by the power switch 15, the antifuse voltage generator 11, and the array voltage generator 12. For example, information of reading operation of the memory control data signal MCDS can be extracted by the power switch 15, the antifuse voltage generator 11, and the array voltage generator 12. Thus, the power switch 15 can output a driving voltage VDDIN equal to 1 volt. The antifuse voltage generator 11 can output an antifuse control signal AF equal to 1 volt. The array voltage generator 12 can output a following control signal FL equal to 1 volt and a selection signal SL equal to 0 volt. In other words, the power switch 15, the antifuse voltage generator 11, and the array voltage generator 12 can be synchronized to facilitate all operation modes of the memory system 200. Additionally, the power switch 15 can also be an external device controlled by user. The memory control data signal MCDS can also be an external signal defined by user. Consequently, the memory system 200 provides satisfactory flexibility of design.

To sum up, the present invention illustrates a memory system with small size antifuse voltage generator having a capability of boosting voltage in conjunction with memory cell. The antifuse voltage generator includes two sub-circuits coupled in parallel. A first sub-circuit includes a voltage doubler for boosting voltage when the antifuse voltage generator is enabled during programming operation. A second sub-circuit includes several transistors for outputting appropriate voltage when the antifuse voltage generator is enabled during reading operation. Since the antifuse voltage generator is achieved by using several simple circuits with low complexity. The circuit size of the antifuse voltage generator can be also reduced. As a result, since the circuit size of the antifuse voltage generator can be reduced, the antifuse voltage generator can be placed to an optimal location on the chip, leading to improve operation performance and flexibility of design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory system comprising:
   a control block comprising:
   an input terminal configured to receive a memory control data signal;
   a first output terminal configured to output a first control signal;
   a second output terminal configured to output a second control signal;
   a third output terminal configured to output a third control signal; and
   a fourth output signal configured to output a fourth control signal;
   an antifuse voltage generator comprising:
   a first input terminal coupled to the second output terminal of the control block and configured to receive the second control signal;
   a second input terminal configured to receive a driving voltage; and
   an output terminal configured to output an antifuse control signal;
   an array voltage generator comprising:
   a first input terminal coupled to the third output terminal of the control block and configured to receive the third control signal;
   a second input terminal configured to receive the driving voltage;
   a first output terminal configured to output a selection signal; and
   a second output terminal configured to output a following control signal; and
   a memory array coupled to the control block, the antifuse voltage generator, and the array voltage generator and configured to access data according to the first control signal, the antifuse control signal, the selection signal, and the following control signal, the memory array comprising a plurality of memory cells, each memory cell comprising:
   a programming selection transistor comprising:
   a first terminal;
   a second terminal configured to receive a bit line program signal; and
   a control terminal configured to receive a word line program signal;
   a following gate transistor comprising:
   a first terminal;
   a second terminal coupled to the first terminal of the programming selection transistor; and
   a control terminal configured to receive the following control signal;
   an antifuse element comprising:
   a first terminal configured to receive the antifuse control signal; and
   a second terminal coupled to the first terminal of the following gate transistor; and
   a reading circuit coupled to the second terminal of the following gate transistor and configured to form a read current according to a bit line read signal, a word line read signal, and the selection signal during a reading operation of the memory cell, the reading circuit comprising:
   a reading transistor comprising:
   a first terminal configured to receive the selection signal;
   a second terminal; and
   a control terminal coupled to the second terminal of the following gate transistor; and
   a read selection transistor comprising:
   a first terminal coupled to the second terminal of the reading transistor;
   a second terminal configured to receive the bit line read signal; and
   a control terminal configured to receive the word line read signal;
   wherein the first control signal comprises address information of the memory array.

2. The memory system of claim 1, further comprising: a sense amplifier coupled to the fourth terminal of the control block and the memory array and configured to detect and compare a bit line current with a reference current.

3. The memory system of claim 1, wherein the antifuse element is a varactor.

4. The memory system of claim 1, wherein the following gate transistor is implemented by a native device, a short channel device or a varactor.

5. The memory system of claim 1, wherein during the reading operation of the memory cell, the bit line program signal is at a second voltage, the word line program signal changes from a first voltage to the second voltage, the following control signal is at the first voltage, the antifuse control signal is at the first voltage, the bit line read signal is at the first voltage, the selection signal is at the second voltage, and the first voltage is greater than the second voltage.

6. The memory system of claim 1, wherein during a programming operation of the memory cell, the bit line program signal is at a second voltage, the word line program signal is at a first voltage, the following control signal is at a voltage level between the first voltage and a third voltage, the antifuse control signal is at the third voltage, the bit line read signal is at the first voltage, the selection signal is at the first voltage, and the third voltage is greater than the first voltage.

7. A memory system comprising:
   a control block comprising:
      an input terminal configured to receive a memory control data signal;
      a first output terminal configured to output a first control signal;
      a second output terminal configured to output a second control signal;
      a third output terminal configured to output a third control signal; and
      a fourth output signal configured to output a fourth control signal;
   an antifuse voltage generator comprising:
      an oscillator comprising:
         a first input terminal configured to receive the second control signal;
         a second input terminal configured to receive the driving voltage;
         a third input terminal configured to receive a second voltage; and
         an output terminal configured to output a clock signal;
      a voltage doubler comprising:
         a first input terminal configured to receive the driving voltage;
         a second input terminal configured to receive the second voltage;
         a third input terminal coupled to the output terminal of the oscillator and configured to receive the clock signal; and
         an output terminal configured to output the antifuse control signal during a programming operation;
      a first transistor comprising:
         a first terminal configured to receive the second voltage;
         a second terminal; and
         a control terminal configured to receive an inverse signal of the second control signal;
      a second transistor comprising:
         a first terminal coupled to the second terminal of the first transistor;
         a second terminal coupled to the output terminal of the voltage doubler; and
         a control terminal configured to receive a gate signal through a logical circuit according to the second control signal; and
      a third transistor comprising:
         a first terminal configured to receive the driving voltage;
         a second terminal coupled to the second terminal of the second transistor and configured to output the antifuse control signal during a reading operation; and
         a control signal coupled to the first terminal of the second transistor;
   an array voltage generator comprising:
      a first input terminal coupled to the third output terminal of the control block and configured to receive the third control signal;
      a second input terminal configured to receive the driving voltage;
      a first output terminal configured to output a selection signal; and
      a second output terminal configured to output a following control signal; and
   a memory array coupled to the control block, the antifuse voltage generator, and the array voltage generator and configured to access data according to the first control signal, the antifuse control signal, the selection signal, and the following control signal;
   wherein the driving voltage is higher than the second voltage, and the first control signal comprises address information of the memory array.

8. The memory system of claim 7, wherein the oscillator is a ring oscillator.

9. The memory system of claim 7, wherein the first transistor is an N-type metal-oxide-semiconductor field-effect transistor, and the second transistor and the third transistor are P-type metal-oxide-semiconductor field-effect transistors.

10. The memory system of claim 7, wherein when the antifuse voltage generator is enabled during the reading operation, the second voltage is equal to a grounded voltage, the second control signal is equal to the grounded voltage, the inverse signal of the second control signal is equal to a first voltage, the gate signal is equal to the driving voltage, and the antifuse control signal is equal to the driving voltage.

11. The memory system of claim 7, wherein when the antifuse voltage generator is enabled during the programming operation, the second voltage is equal to a grounded voltage, the second control signal is equal to a first voltage, the inverse signal of the second control signal is equal to a grounded voltage, the gate signal is changed from the driving voltage to the grounded voltage, and the antifuse control signal is equal to two times of the driving voltage.

12. The memory system of claim 11, wherein the driving voltage of the antifuse voltage generator during the programming operation is greater than the driving voltage of the antifuse voltage generator during the reading operation.

13. The memory system of claim 11, wherein the gate signal is changed from the grounded voltage to the driving voltage after the gate signal is changed from the driving voltage to the grounded voltage.

14. A memory system comprising:
   a control block comprising:
      an input terminal configured to receive a memory control data signal;
      a first output terminal configured to output a first control signal;
      a second output terminal configured to output a second control signal;
      a third output terminal configured to output a third control signal; and
      a fourth output signal configured to output a fourth control signal;
   an antifuse voltage generator comprising:
      an oscillator comprising:
         a first input terminal configured to receive the second control signal;
         a second input terminal configured to receive the driving voltage;
         a third input terminal configured to receive a second voltage; and
         an output terminal configured to output a clock signal;
      a voltage doubler comprising:
         a first input terminal configured to receive the driving voltage;
         a second input terminal configured to receive the second voltage;

a third input terminal coupled to the output terminal of the oscillator and configured to receive the clock signal; and
an output terminal configured to output the antifuse control signal during a programming operation;
a first transistor comprising:
a first terminal configured to receive the second voltage;
a second terminal; and
a control terminal configured to receive an inverse signal of the second control signal;
a fourth transistor comprising:
a first terminal coupled to the second terminal of the first transistor;
a second terminal; and
a control terminal configured to receive the driving voltage;
a second transistor comprising:
a first terminal coupled to the second terminal of the fourth transistor;
a second terminal coupled to the output terminal of the voltage doubler; and
a control terminal configured to receive a gate signal through a logical circuit according to the second control signal; and
a third transistor comprising:
a first terminal configured to receive the driving voltage;
a second terminal coupled to the second terminal of the second transistor and configured to output the antifuse control signal during a reading operation; and
a control signal coupled to the first terminal of the second transistor;
an array voltage generator comprising:
a first input terminal coupled to the third output terminal of the control block and configured to receive the third control signal;
a second input terminal configured to receive the driving voltage;
a first output terminal configured to output a selection signal; and
a second output terminal configured to output a following control signal; and
a memory array coupled to the control block, the antifuse voltage generator, and the array voltage generator and configured to access data according to the first control signal, the antifuse control signal, the selection signal, and the following control signal;
wherein the driving voltage is greater than the second voltage, and the first control signal comprises address information of the memory array.

15. The memory system of claim 14, wherein the oscillator is a ring oscillator.

16. The memory system of claim 14, wherein the first transistor and the fourth transistor are N-type metal-oxide-semiconductor field-effect transistors, and the second transistor and the third transistor are P-type metal-oxide-semiconductor field-effect transistors.

17. The memory system of claim 14, wherein when the antifuse voltage generator is enabled during the reading operation, the second voltage is equal to a grounded voltage, the second control signal is equal to the grounded voltage, the inverse signal of the second control signal is equal to a first voltage, the gate signal is equal to the driving voltage, and the antifuse control signal is equal to the driving voltage.

18. The memory system of claim 14, wherein when the antifuse voltage generator is enabled during the programming operation, the second voltage is equal to a grounded voltage, the second control signal is equal to a first voltage, the inverse signal of the second control signal is equal to a grounded voltage, the gate signal is changed from the driving voltage to the grounded voltage, and the antifuse control signal is equal to two times of the driving voltage.

19. The memory system of claim 18, wherein the driving voltage of the antifuse voltage generator during the programming operation is greater than the driving voltage of the antifuse voltage generator during the reading operation.

20. The memory system of claim 18, wherein the gate signal is changed from the grounded voltage to the driving voltage after the gate signal is changed from the driving voltage to the grounded voltage.

* * * * *